United States Patent [19]

Mizuguchi et al.

[11] Patent Number: 5,316,852

[45] Date of Patent: May 31, 1994

[54] COATED MATERIAL AND THE USE THEREOF

[75] Inventors: Jin Mizuguchi, Fribourg; Gérald Giller, Bulle; Alain C. Rochat, Fribourg, all of Switzerland

[73] Assignee: Ciba-Geigy Corporation, Ardsley, N.Y.

[21] Appl. No.: 931,914

[22] Filed: Aug. 18, 1992

[30] Foreign Application Priority Data

Aug. 26, 1991 [CH] Switzerland ............. 2495/91-0

[51] Int. Cl.$^5$ ............. C07D 487/04; G03G 5/06
[52] U.S. Cl. ............. 428/411.1; 430/78; 503/223; 546/256; 546/271; 548/453
[58] Field of Search ............. 428/411.1; 546/256, 546/271; 548/453; 503/223; 430/78

[56] References Cited

U.S. PATENT DOCUMENTS

| | | | |
|---|---|---|---|
| 4,579,949 | 4/1986 | Rochat et al. | 546/167 |
| 4,632,893 | 12/1986 | Rochat et al. | 430/58 |
| 4,791,204 | 12/1988 | Jost et al. | 548/101 |
| 4,791,211 | 12/1988 | Lund et al. | 548/260 |
| 4,914,211 | 4/1990 | Jost et al. | 548/453 |
| 5,144,333 | 9/1992 | Mizuguchi et al. | 346/1.1 |

FOREIGN PATENT DOCUMENTS

| | | |
|---|---|---|
| 224445 | 6/1987 | European Pat. Off. |
| 3189166 | 6/1989 | European Pat. Off. |
| 353184 | 1/1990 | European Pat. Off. |
| 401791 | 12/1990 | European Pat. Off. |
| 490817 | 6/1992 | European Pat. Off. |
| 3713459 | 8/1988 | Fed. Rep. of Germany. |

OTHER PUBLICATIONS

Kunststoffe 76, (1986) Carl Hanser, pp. 1077–1081 Verlag, Munchen.
J. Appl. Phys. 60 (8) pp. 2932–2937 (1986).
Derwent Abstact 92–202033/25 of EP–490,817. (Jun. 1992).
Chem. Abst. vol. 110, (1989: 59524s.
Chem. Abst. 90–031710/05 of EP 353,184 (Jan. 1990).
G. Kampf et al. "Fabrmittel/Polymer-Systeme Als Nichtlöschbare und löschbare Datenspeicher", Kunststoffe 76 (1986) 11, pp. 1077–1081.

Primary Examiner—Richard L. Raymond
Attorney, Agent, or Firm—Kevin T. Mansfield; George R. Dohmann

[57] ABSTRACT

A coated material comprising a substrate which is coated with a layer of a pyrrolopyrrole of formula I

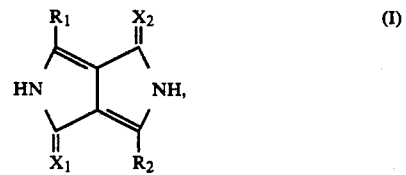

wherein $R_1$ and $R_2$ may be 4-pyridyl and $X_1$ and $X_2$ are O, said compound of formula I being at least partially in the form of a salt of a strong acid, is suitable for use as an optical recording material and, owing to its electrical conductivity and photoconductivity, as antistatically treated material, as sensor, photoreceptor and solar battery.

12 Claims, No Drawings

COATED MATERIAL AND THE USE THEREOF

The present invention relates to a coated material comprising a substrate which is coated on at least one side with a pyrrolopyrrole which is converted with acid vapours into corresponding salts of the acids. The invention further relates to a process for storing and reading information by irradiating the pyrrolopyrrole layer of said substrate with laser light, to the coated material, to the use of conductive substrates so coated as photoreceptors, for making solar batteries and sensors, and to the use of so coated dielectric substrates as antistatically treated materials.

Optical recording substrates and media for storing information are known (q.v. for example "Farbmittel/-Polymer-Systeme als Datenspeicher" by G. Kämpf et al, in Kunststoffe pp. 1077-1081, Carl Hanser Verlag, Munich 1986; or "Erasable laser recording in an organic dye-binder optical disk medium", by M. C. Gupta et al, in J. Appl. Phys. 60(8), 1986, pp. 2932-2937.]. In these publications, information is recorded by treatment with light of specific wavelengths and intensity or with other suitable energy-rich radiation, as with laser light. Absorption of the radiation effects a local rise in temperature at the irradiated areas, so that pits or local phase transfers are produced at the surface of the recording substrate and/or media by evaporation, softening or melting, and result in a change of the refractive index, of the absorption or of the reflectivity. By means of lasers it is possible to produce holes, bubbles or pits of about 1 to several $\mu m^2$ in size, or to effect a phase transfer, which information can in turn be read by a laser of lesser intensity utilising the altered reflection or light-scattering behaviour of these holes/bubbles/pits or phase transfer. Suitable recording materials are typically metals, synthetic resins or other light-absorbing layers containing, for example, dyes.

It is disclosed in EP-A-401 791 that the change in the absorption spectrum and/or the change in the photoconductivity of specific organic compounds after their treatment with an organic solvent can be used with advantage for storing information. To this end, the surface of the organic recording layer is treated with an organic solvent in the liquid or gaseous state in accordance with the input of information, for example by spraying the surface from a nozzle, as typically in an ink-jet printer.

Surprisingly, it has now been found that treatment of a thin layer of pyrrolopyrroles on a substrate with vapours of a strong acid effects a pronounced hypsochromic or bathochromic and reversible shift of the absorption maxima in conjunction with a marked colour change. Such layer materials are therefore admirably suited for use as optical recording materials for storing and reproducing information by irradiation with laser light, the acid-treated layer acting as photosensitive layer. The hypsochromic or bathochromic shift can be reversed in surprisingly simple manner by the action of heat or simply by washing with water. Such acid-treated layers can also be used for providing dielectric materials with an antistatic finish.

It has also surprisingly been found that, in contrast to untreated materials, a layer material treated with acid vapours has a lower electrical resistance (improved dark conductivity) and an excellent photoconductivity which can be further substantially enhanced by doping with halogens, conveniently with bromine. The layer materials can therefore also be used for the making photoreceptors, solar batteries and sensors.

It is an object of the invention to provide a coated material comprising a substrate which is coated on at least one side with a thin layer of a pyrrolopyrrole of formula I or a mixture of pyrrolopyrroles of formula I

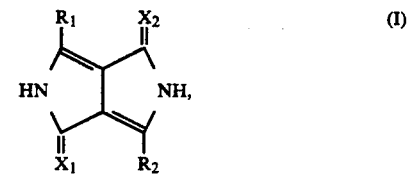

wherein
$R_1$ is a phenyl or pyridyl radical of formula

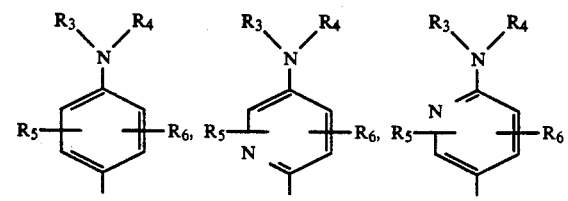

which radical is substituted by a tert-amino group, or a is pyridyl group of formula

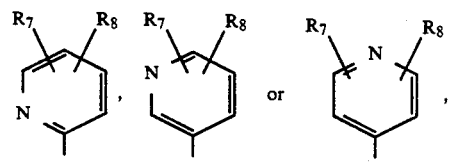

$R_2$ is a group

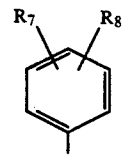

or has the same meaning as $R_1$, and $R_3$ and $R_4$ are each independently of the other $C_1$-$C_{18}$alkyl, $C_5$-$C_6$cycloalkyl, $C_1$-$C_{18}$alkyl which is substituted by —OH or —SH, or unsubstituted phenyl, benzyl or phenylethyl, or phenyl, benzyl or phenylethyl which is substituted by halogen, $C_1$-$C_{12}$alkyl, $C_1$-$C_{12}$alkoxy, cyano or nitro, or, together with the linking nitrogen atom, are a 5- or 6-membered heterocyclic radical selected from the group consisting of pyrrolidinyl, piperidyl, pyrrolyl, imidazolyl, pyrazolyl, triazolyl, piperazinyl, morpholinyl and thiomorpholinyl, $R_5$ to $R_8$ are each independently of one another hydrogen, halogen, $C_1$-$C_{12}$alkyl, $C_1$-$C_{12}$alkoxy, $C_1$-$C_{12}$alkylmercapto or cyano, and $X_1$ and $X_2$ are each independently of the other O or S, which compounds of formula I are converted at least partially into salts of strong acids.

Depending on the envisaged end use requirement, suitable substrates comprise a very wide range of materials, including paper, glass, ceramic materials, plastics, laminates, metals and metal alloys and metal oxides.

Depending on the utility, the substrates may be opaque or transparent.

The layer of compounds of formula I may have a thickness of 500 to 5000 Å, preferably of 500 to 4000 Å, more particularly of 500 to 3000 Å and, most preferably, of 500 to 2000 Å.

The layer of compounds of formula I can be converted partially or completely into salts of strong acids, depending on the treatment time of the layer of compounds of formula I with strong acids. Aqueous solutions or, preferably acid vapours, can be used for the treatment with acid. For the purposes of this invention a brief treatment time in the order of several seconds will normally suffice, in which case substantially only the surface of the layer of compounds of formula I will be converted into salts.

It is preferred to treat the layer of compounds of formula I with vapours of a strong acid integrally (i.e. on the entire surface), thereby effecting a bathochromic or hypsochromic shift in the absorption maximum. Basically any strong acid which has a sufficiently high vapour pressure at room temperature is suitable for this acid treatment. Exemplary of strong acids are nitric acid, hydrochloric acid, hydrobromic acid, trichloroacetic acid and trifluoroacetic acid. Nitric acid is especially preferred in the practice of this invention. The colour change normally occurs after only a brief treatment with acid, typically after the layer has been exposed for about 5 seconds to the vapours of nitric acid.

It is a further object of the invention to provide a process for the production of the novel material, which comprises bringing a substrate, at least one surface of which is coated with a pyrrolopyrrole of formula I, into contact with a strong acid and converting the pyrrolopyrrole of formula I at least partially into a salt of the said acid.

Compounds of formula I are known and can be prepared by known methods. Compounds of formula I, wherein $X_1$ and $X_2$ are O, and the preparation thereof, are disclosed in U.S. Pat. No. 4,579,949 and in EP-A 353 184. Compounds of formula I, wherein $X_1$ and/or $X_2$ is S, are disclosed in U.S. Pat. No. 4,632,893 or can be prepared by the methods described therein, conveniently by thionation of corresponding diketopyrrolopyrroles (i.e. compounds wherein $X_1$ and $X_2$ are O).

If one of the substituents $R_5$ to $R_8$ of the compounds of formula I is halogen, or if groups $R_3$ and $R_4$ are substituted by halogen, then halogen will be understood as meaning iodo, fluoro and, preferably, chloro or bromo.

$C_1-C_{18}$Alkyl groups are typically methyl, ethyl, n-propyl, isopropyl, n-butyl, sec-butyl, tert-butyl, n-pentyl, tert-amyl, n-hexyl, 1,1,3,3-tetramethylbutyl, n-heptyl, n-octyl, nonyl, decyl, undecyl, dodecyl, tetradecyl, heptadecyl and octadecyl.

$C_1-C_{12}$Alkoxy groups are typically methoxy, ethoxy, propoxy, isopropoxy, n-butoxy, sec-butoxy, tert-butoxy, n-pentoxy, tert-amyloxy, n-hexyloxy, n-heptyloxy, n-octyloxy, decyloxy and dodecyloxy.

$C_1-C_{12}$Alkylmercapto groups correspond to the above $C_1-C_{12}$alkoxy groups.

$C_5-C_6$Cycloalkyl groups are typically cyclopentyl and, preferably, cyclohexyl.

$R_3$ and $R_4$ as substituted phenyl, benzyl or phenylethyl preferably contain one of the above cited substituents. Unsubstituted radicals are especially preferred.

Preferred compounds of formula I are suitably those wherein the groups $R_1$ and $R_2$, $X_1$ and $X_2$, $R_3$ and $R_4$, $R_5$ and $R_6$ and $R_7$ and $R_8$ are each identical.

Also preferred are compounds wherein $R_1$ is pyridyl or a group

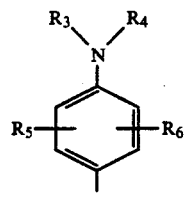

and $R_2$ is a group

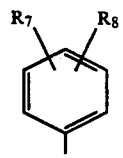

or has the meaning of $R_1$, wherein $R_3$ and $R_4$ are identical and are $C_1-C_{12}$alkyl, 2-hydroxyethyl, 2-mercaptoethyl, cyclohexyl, benzyl or phenylethyl, or, together with the linking nitrogen atom, are pyrrolidinyl, piperidyl, morpholinyl or thiomorpholinyl, and $R_5$ to $R_8$ are each independently of one another hydrogen, chloro, bromo, $C_1-C_4$alkyl, $C_1-C_4$alkoxy or $C_1-C_4$alkylmercapto.

Particularly preferred compounds are those wherein $R_3$ and $R_4$ are identical and are $C_1-C_4$alkyl, 2-hydroxyethyl or 2-mercaptoethyl or, together with the linking nitrogen atom, are pyrrolidinyl, piperidyl, morpholinyl or thiomorpholinyl, and $R_5$ to $R_8$ are each independently of one another hydrogen, chloro or bromo.

The most preferred compounds of formula I are those wherein $R_1$ and $R_2$ are 2-, 3- or, preferably, 4-pyridyl, and $X_1$ and $X_2$ are O, or those wherein $R_1$ and $R_2$ are a group

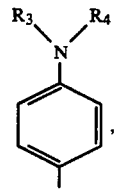

$R_3$ and $R_4$ are each methyl or, together with the linking nitrogen atom, are pyrrolidinyl, piperidyl or morpholinyl, and $X_1$ and $X_2$ are identical and are O or preferably S.

Very particularly preferred compounds of formula I are 1,4-diketo-3,6-bis(4'-pyridyl)pyrrolo[3,4-c]pyrrole, 1,4-diketo-3,6-bis(3'-pyridyl)pyrrolo[3,4-c]pyrrole and 1,4-dithioketo-3,6-bis(4'-dimethylaminophenyl)pyrrolo[3,4-c]pyrrole.

It is also possible to use mixtures of the pyrrolopyrroles of the above structures.

It is yet a further object of the invention to provide a process for storing information in a novel coated material in which the layer of compounds of formula I with salts of strong acids acts as recording layer, which process comprises irradiating said recording layer with laser light according to the input of information and changing the absorption spectrum of the recording layer such that information is written and stored at the irradiated areas.

The inventive process is based on the surprising fact that compounds of formula I in the solid state, conveniently in the form of a thin layer on a substrate, undergo a bathochromic or hypsochromic shift of the absorption maxima when exposed to acid vapours. The protonation of compounds of formula I, wherein $R_1$ and $R_2$ are pyridyl, normally effect a bathochromic shift, whereas the protonation of compounds wherein $R_1$ and $R_2$ are a tert-amino-substituted radical, bring about a hypsochromic shift. The different coloured form so induced has superior light stability, but can be reconverted to the original form without salts with strong acids, conveniently by heating, typically at a temperature of about 150° C., whereupon a hypsochromic or bathochromic change in colour results selectively at the heated areas. The above described process is reversible and can be repeated any number of times. The process can be exemplified as follows by the compound of formula I, wherein $R_1$ and $R_2$ are 4-pyridyl and $X_1$ and $X_2$ are O:

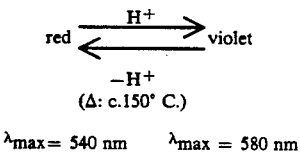

$\lambda_{max} = 540$ nm     $\lambda_{max} = 580$ nm

Information is written on the violet form with a laser. The absorbed light energy is converted into thermal energy so as to cause deprotonation and effect a change in colour at the irradiated areas. The information so written and stored can be read out optically any number of times or, if desired, deleted by non-selective heating of the entire layer.

A high storage density can be achieved with the novel process. It is thus entirely possible to produce a dot size ("pixel") smaller than $\mu m^2$.

The layer structure of the inventive recording materials used in the recording process can differ in accordance with the manner in which the system functions (transmission or reflection). If the recording system functions according to a change in light transmission, the structure may suitably comprise: transparent substrate/recording layer/if appropriate, transparent protective layer. The radiation for writing and reading out information can be applied either from the substrate side of the system or from the recording layer or protective layer side, the light detector always being on the adjacent side.

If the recording process functions according to a change in reflectivity, then other layered structures are possible for the substrate: transparent substrate/recording layer/reflective layer/if appropriate, protective layer (not necessarily transparent), or substrate (not necessarily transparent)/reflective layer/recording layer/if appropriate, transparent protective layer. In the former case, the radiation is applied from the substrate side of the system, whereas in the latter case the radiation is applied from the recording layer or, if present, from the protective layer side of the system. In both cases, the light detector is on the same side as the light source. The first mentioned layer structure is generally preferred.

The pyrrolopyrrole layer for the inventive materials is conveniently prepared by vapour deposition or sputtering under a high vacuum. The procedure comprises vapour depositing or sputtering a pyrrolopyrrole or a mixture of pyrrolopyrroles on to a substrate under a high vacuum, followed by protonation with acid vapour. Two or more different pyrrolopyrroles can be vapourised on to the substrate simultaneously or stepwise, layer by layer (i.e. multilayer application) using two or more vapourising sources. After vapour deposition, the salts of strong acids are conveniently produced by treating the layer with acid vapours. The thickness of the recording layer can vary over a wide range. Preferably the layer has a thickness of 200 to 3000 Å, more particularly of 500 to 1200 Å. Most preferably the layer thickness is about 700 to 1000 Å.

Suitable substrates for the utility as information recording material are typically glass, polycarbonates, polymethylmethacrylates, polyolefins or epoxy resins. Any metals, including metal plates, films or foils of e.g. aluminium, as well as metal-coated plastics sheets and films, can also be used.

The light-reflecting layer should be so composed that it reflects as quantitatively as possible the light used for reading out information by scanning. Suitable light-reflective materials include, aluminium, gold, platinum, nickel, silver, rhodium, tin, lead, bismuth and copper. Aluminium and gold are preferred. These materials may be coated on to a recording substrate by vapour deposition or sputtering under a high vacuum. The thickness of the light-reflecting layer shall be such that it reflects the light required for scanning as completely as possible. Thus the layer preferably has a thickness of 1000 bis 3500 Å, more particularly of about 2000 Å. For this purpose, reflectors of high reflectance are advantageous in the appropriate wavelength. The light-reflective layer conveniently has an optically smooth level surface and said surface is of such a nature that the recording layer adheres firmly to it.

As already stated above, the recording layer and the metallic reflective layers can be applied by vapour deposition under vacuum. The material to be applied is first put into a suitable vessel, which may be equipped with a resistance heating, and placed into a vacuum chamber. The substrate on to which the material is to be deposited is clamped above the vessel with the material to be vapourised. The clamp is constructed such that the substrate can be rotated (e.g. at 50 rpm) and heated. The vacuum chamber is evacuated to about $1.3 \cdot 10^{-5}$ to $1.3 \cdot 10^{-6}$ mbar ($10^{-5}$ to $10^{-6}$ torr), and the heating is adjusted such that the temperature of the material to be deposited rises to its vapourising temperature. The deposition is continued until the layer applied has the desired thickness. Depending on the system, first the recording material and then the reflective layer is applied, or conversely. The application of a reflective layer can in some cases be dispensed with.

It is particularly preferred to apply the metallic reflective layer by the sputtering technique on account of the good bonding to the substrate. The material to be applied (e.g. aluminum) in the form of a plate is used as a "target" electrode, whereas the substrate is mounted on the counter-electrode. First the vacuum chamber is evacuated to about $10^{-6}$ torr and then inert gas, e.g. argon, is introduced until the pressure is about $10^{-3}$ torr. Between the target electrode and the counter-electrode a high direct current voltage or radio-frequency voltage of several kV is applied, optionally using permanent magnets (magnetron sputtering) so as to produce Ar+ plasma. The metal particles sputtered by the Ar+ ions of the target electrode are uniformly and firmly deposited on the substrate. Coating is effected within a few to several minutes, depending on the target materials, sputtering technique and sputtering conditions. This sputtering technique is described in detail in the technical literature (e.g. W. Kern and L. Vossen, "Thin Film Processes", Academic Press, 1978).

The thickness of the layer formed by vapour deposition can be monitored with the aid of an optical system which measures the reflectivity of the reflective surface coated with the absorption material. It is preferred to monitor the growth of the layer thickness with a quartz resonator.

The recording system may also contain further colorants such as inorganic or organic pigments or, in some cases, inorganic or organic adiabatic layers which are inactive to the acid vapour treatment of this invention.

As mentioned above, a protective layer which does not impair the recording and reading out of information can, if expedient, be applied to the recording layer or light-reflecting layer. This embodiment of the invention is preferred. Suitable protective layers are typically UV-crosslinkable polymers based on polyacrylates such as RENGOLUX ® RZ 3200/003 and 3203/001 sold by Morton International-Dr. Renger or SD-17 ® sold by DIC. The protective coating is suitably applied by a spin coater and crosslinked by UV light. The layer thickness is preferably about 5–20 μm, more particularly about 8–10 μm.

As already mentioned, lasers are suitable for writing information on the recording layer, including He-Ne lasers (633 nm), argon lasers (514 nm) or diode lasers based on GaAsAl (780 nm), GaAs (830 nm) and InGaAlP (650 nm). The information can be written with a light modulator point by point or linearly.

The novel process makes it possible to write/store information and is distinguished by clear edge definition, a high degree of reliability and a low signal-to-noise ratio. The stored information is easily legible and the recording system is dimensionally stable, light- and weather-resistant, and is also very resistant to temperature changes and UV rays.

As already mentioned above, the process of this invention effects a shift in the absorption spectrum at the irradiated area or areas of the recording material. The shift in the absorption spectrum and/or the stored information can be read out with a photodetector using a low-energy laser. Suitable photodetectors comprise typically PIN diodes, which make it possible to measure the spectral changes by transmission or absorption and, in particular, reflection.

Thus after exposure 1,4-diketo-3,6-bis(4'-pyridyl)pyrrolo[3,4-c]pyyrole undergoes a visual colour change from violet to red (shift in the absorption of c. 580 to c. 540 nm), the corresponding 3'-pyridyl derivative undergoes a spectral change of c. 550 nm to c. 535 nm, and 1,4-dithioketo-3,6-bis(4'-dimethylaminophenyl)pyrrolo[3,4-c]pyrrole undergoes a spectral change from c. 630 nm to c. 740 nm.

Another object of the invention is the use of the novel substrate as optical recording material.

A still further object of the invention is the provision of which material consists of compounds of formula I which are at least partially salts of strong acids, which material contains the information in the form of bits of higher or lower absorption than their environment in the recording layer.

Further utilities are also possible by virtue of the electrical conductivity and photoconductivity of the material. The conductivity can be further substantially enhanced by treating the layer of compounds of formula I containing salts of strong acids with halogens, preferably bromine and iodine.

The pyrrolopyrrole compounds of formula I as defined herein can also be used in the form of salts of strong acids to provide dielectric substrates with an antistatic finish, in which case the substrate is a dielectric substrate. This utility constitutes a further object of the invention. For this utility the layer thickness of the pyrrolopyrroles in the form of salts of strong acids is preferably from 500 to 5000 Å, more particularly from 800 to 4000 Å and, most preferably, from 1000 to 3000 Å.

By virtue of its photoconductivity, the novel coated material is also suitable for making photoreceptors. For this utility the substrate consists of an electrically conductive material, typically a metal such as aluminium, and a charge-carrying layer is present on the layer of pyrrolopyrroles of formula I in the form of salts of strong acids. The use and preparation of such photoreceptors and materials for the charge-carrying layer are known to the skilled person and described, inter alia, in U.S. Pat. No. 4,632,893. The photoreceptors constitute a further object of the invention. The layer thickness of the pyrrolopyrroles in the form of salts of strong acids for this utility is preferably from 500 to 4000 Å, more particularly from 800 to 3000 Å and, most preferably, from 1000 to 2500 Å. Such photoreceptors are used in the technique of xerography.

The novel coated material is also suitable for making solar cells and solar batteries. For this utility the substrate consists of a transparent electrical material, conveniently of glass coated with electrically conductive indium/tin oxide (ITO) or with glass coated with thin metal layers, the coated glass acting as transparent electrode, and a further electrode consisting of an electrical conductor, typically aluminium, copper or gold, is present on the layer of pyrrolopyrroles of formula I in the form of salts of strong acids. A Schottky barrier for the charge carrier separation is provided between the photoconductor layer and one of the electrodes. Such solar batteries constitute a further object of the invention. The layer of pyrrolopyrroles of formula I in the form of salts of strong acids preferably has a thickness of 500 to 3000 Å, more particularly from 500 to 2000 Å and, most preferably, from 500 to 1500 Å.

A substrate coated with pyrrolopyrroles of formula I is also suitable for making sensors. For this utility the substrate is preferably also in the form of an electrode, conveniently a pair of separate electrodes. It is, however, especially advantageous to apply to the surface a cathode and an anode arranged in the form of two interlocking combs and on which the layer of pyrrolopyroles of formula I is present. The change in conductivity induced by salt formation before and after contact with acids can be determined by measuring the resistances before and after the treatment with acids. The layer of pyrrolopyrroles of formula I is thus the active layer. Such substrates arranged as sensors constitute yet a further object of the invention. The layer of pyrrolopyrroles of formula I has a thickness of 500 to 3000 Å, more particularly from 500 to 2000 Å and, most preferably, from 500 to 1500 Å.

The invention is illustrated by the following Examples.

EXAMPLE 1

Aluminium is vapour deposited under a high vacuum on to a glass substrate to a layer thickness of c. 2500 Å. Then 1,4-diketo-3,6-bis(4'-pyridyl)pyrrolo[3,4-c]pyrrole is vapourised under the same conditions on to the aluminium layer to a layer thickness of c. 1000 Å. The recording plate so obtained is exposed for about 5 seconds to nitric acid vapour, whereupon a bathochromic shift occurs (absorption maximum: 540 to 580 nm). Electronic information is written dotwise with an Ar+ laser of 514 nm wavelength, and the change in reflectance is measured at 600 nm with a microscopic spectrophotometer (Carl Zeiss: UMSP 80). The reflectivity before writing is c. 5% and after writing c. 53%.

EXAMPLE 2

Example 1 is repeated, but depositing 1,4-diketo-3,6-bis(3'-pyridyl)pyrrolo[3,4-c]pyrrole instead of 1,4-diketo-3,6-bis(4'-pyridyl)pyrrolo[3,4-c]pyrrole to a layer thickness of 700 Å. The reflectivity is measured at 580 nm and is c. 25% before writing and c. 61% after writing.

EXAMPLE 3

Example 1 is repeated, but depositing 1,4-diketo-3,6-bis(4'-dimethylaminophenyl)pyrrolo[3,4-c]pyrrole instead of 1,4-diketo-3,6-bis(4'-pyridyl)pyrrolo[3,4-c]pyrrole to a layer thickness of 900 Å. The information is written with a laser diode of 780 nm wavelength and the reflectivity is measured at 780 nm with a PIN diode. The reflectivity is c. 6% before writing and c. 52% after writing.

EXAMPLE 4

Preparation of a photoreceptor 1,4-Diketo-3,6-bis(4'-pyridyl)pyrrolo[3,4-c]pyrrole is vapour deposited as charge-generating material under a high vacuum on to an aluminium substrate to a layer thickness of c. 1500 Å, and the layer is then exposed for 5 seconds to the vapours of concentrated nitric acid. The charge-transporting layer is then prepared from a solution of polycarbonate and 4-diethylaminobenzaldehyde-1,1-diphenylhydrazone (1:1 parts by weight) in $CHCl_3$ to give a 20 μm thick layer of polycarbonate and 4-diethylaminobenzaldehyde-1,1-diphenylhydrazone (1:1). The charge and discharge characteristics of the photoreceptor are measured with a paper analyzer supplied by Kawaguchi Denki (model SP-428). The charge acceptance is $-1200$ V and the $E_{\frac{1}{2}}$ photosensitivity in the visible region is 3 Lux.sec ($E_{\frac{1}{2}}$: the reciprocal energy necessary to decrease the surface potential to one half of its initial value).

EXAMPLE 5

Preparation of a sensor

A glass substrate on the surface of which a pair of gold electrodes arranged in the form of two interlocking combs is mounted is coated under a high vacuum to a layer thickness of 800 Å with 1,4-diketo-3,6-bis(4'-pyridyl)pyrrolo[3,4-c]pyrrole. A battery of 6 V and a resistance of 100 kΩ are connected in series to this sensor. The reduction in resistivity by treating the sensor with vapours of concentrated nitric acid is determined by measuring the voltage developed across the resistance. The voltage changes from 6 μV (untreated) to 600 mV.

EXAMPLE 6

Determination of the antistatic effect 1,4-Diketo-3,6-bis(4'-pyridyl)pyrrolo[3,4-c]pyrrole is vapour deposited under a high vacuum on to an aluminium substrate to a layer thickness of 2000 Å, and the positive and negative charges before and after the treatment with nitric acid vapours are measured with the paper analyzer according to Example 4. Negative potentials of 1000 V and 5 V and positive potentials of 800 V and 8 V are measured.

What is claimed is:

1. A coated material comprising a substrate which is coated on at least one side with a thin layer of a pyrrolopyrrole of formula I or a mixture of pyrrolopyrroles of formula I

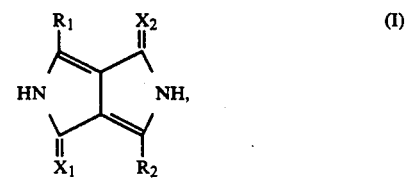

wherein $R_1$ is a phenyl or pyridyl radical of formula

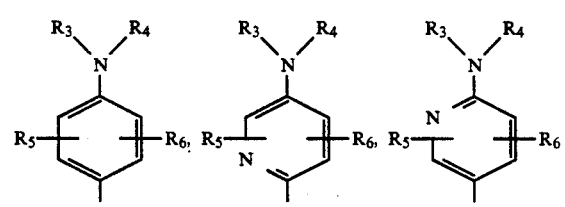

or is a pyridyl group of formula

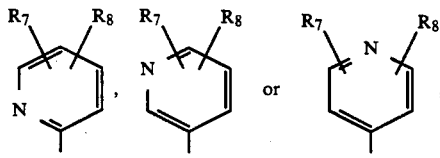

$R_2$ is a group

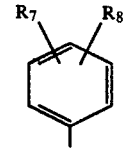

or has the same meaning as $R_1$, and $R_3$ and $R_4$ are each independently of the other $C_1$–$C_{18}$alkyl, $C_5$–$C_6$cycloalkyl, $C_1$–$C_{18}$alkyl which is substituted by —OH or —SH, or unsubtituted phenyl, benzyl or phenylethyl, or phenyl, benzyl or phenylethyl which are substituted by halogen, $C_1$–$C_{12}$alkyl, $C_1$–$C_{12}$alkoxy, cyano or nitro, or, together with the linking nitrogen atom, are a 5- or 6-membered heterocyclic radical selected from the group consisting of pyrrolidinyl, piperidyl, pyrrolyl, imidazolyl, pyrazolyl, triazolyl, piperazinyl, morpholinyl and thiomorpholinyl, $R_5$ to $R_8$ are each independently of one another hydrogen, halogen, $C_1$–$C_{12}$alkyl, $C_1$–$C_{12}$alkoxy, $C_1$-$C_{12}$alkylmercapto or cyano, and $X_1$ and $X_2$ are each independently of the other O or S, which compound of formula I is converted at least partially into a salt of a strong acid.

2. A material according to claim 1, wherein the groups $R_1$ and $R_2$ and $X_1$ and $X_2$ in the compounds of formula I are each identical.

3. A material according to claim 1, wherein the groups $R_3$ and $R_4$, $R_5$ and $R_6$ and $R_7$ and $R_8$ in the compounds of formula I are each identical.

4. A material according to claim 1, wherein $R_1$ is pyridyl or a group

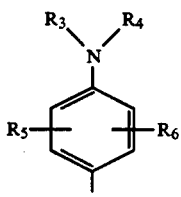

and $R_2$ is a group

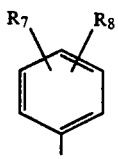

or has the meaning of $R_1$, wherein $R_3$ and $R_4$ are identical and are $C_1$-$C_{12}$alkyl, 2-hydroxyethyl, 2-mercaptoethyl, cyclohexyl, benzyl or phenylethyl, or, together with the linking nitrogen atom, are pyrrolidinyl, piperidyl, morpholinyl or thiomorpholinyl, and $R_5$ to $R_8$ are each independently of one another hydrogen, chloro, bromo, $C_1$-$C_4$alkyl, $C_1$-$C_4$alkoxy or $C_1$-$C_4$alkylmercapto.

5. A material according to claim 1, wherein $R_3$ and $R_4$ are identical and are $C_1$-$C_4$alkyl, 2-hydroxyethyl or 2-mercaptoethyl or, together with the linking nitrogen atom, are pyrrolidinyl, piperidyl, morpholinyl or thiomorpholinyl, and $R_5$ to $R_8$ are each independently of one another hydrogen, chloro or bromo.

6. A material according to claim 1, wherein $R_1$ and $R_2$ are 2-, 3-, 4-pyridyl, and $X_1$ and $X_2$ are O, or wherein $R_1$ and $R_2$ are a group

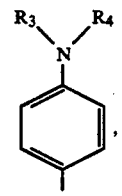

$R_3$ and $R_4$ are each methyl or, together with the linking nitrogen atom, are pyrrolidinyl, piperidyl or morpholinyl, and $X_1$ and $X_2$ are identical and are O or S.

7. A material according to claim 1, wherein the pyrrolopyrrole layer forms at least partially salts with nitric acid, hydrochloric acid, hydrobromic acid, trichloroacetic acid or trifluoroacetic acid.

8. A material according to claim 1, wherein the layer of compound of formula I has a thickness of 500 to 5000 Å.

9. A material according to claim 1, wherein the substrate consists of paper, glass, ceramic materials, plastics, laminates, metals, metal alloys or metal oxides.

10. A material according to claim 1, wherein the compound of formula I is selected from the group consisting of 1,4-diketo-3,6-bis(4'-pyridyl)pyrrolo[3,4-c]pyrrole, 1,4-diketo-3,6-bis(3'-pyridyl)pyrrolo[3,4-c]pyrrole and 1,4-dithioketo-3,6-bis(4'-dimethylaminophenyl)pyrrolo[3,4-c]pyrrole.

11. A material of claim 6 wherein $R_1$ is 4-pyridyl.

12. A material of claim 6 wherein $X_1$ and $X_2$ are S.

* * * * *